(12) United States Patent
Smith et al.

(10) Patent No.: US 11,762,372 B2
(45) Date of Patent: *Sep. 19, 2023

(54) SYSTEMS AND METHODS FOR HEATING COMPUTING ELEMENTS IN VEHICLES

(71) Applicant: ARGO AI, LLC, Pittsburgh, PA (US)

(72) Inventors: Joshua S. Smith, Livonia, MI (US); Brian T. Margosian, Lathrup Village, MI (US); Kevin J. Nealis, Yardley, PA (US); Ryan J. Skaff, Farmington Hills, MI (US); Kenneth John Jackson, Dearborn, MI (US)

(73) Assignee: ARGO AI, LLC, Pittsburgh, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/883,978

(22) Filed: Aug. 9, 2022

(65) Prior Publication Data

US 2022/0386515 A1    Dec. 1, 2022

Related U.S. Application Data

(63) Continuation of application No. 17/121,107, filed on Dec. 14, 2020, now Pat. No. 11,422,534.

(51) Int. Cl.
*G06F 1/00*       (2006.01)
*G05B 19/4155*    (2006.01)
(Continued)

(52) U.S. Cl.
CPC ........ *G05B 19/4155* (2013.01); *G01S 17/931* (2020.01); *G06F 1/206* (2013.01); *H05K 7/20854* (2013.01); *G05B 2219/49216* (2013.01)

(58) Field of Classification Search
CPC .... G06F 1/206; G06F 11/004; G06F 2201/81; G06F 11/3013; G06F 11/3466;
(Continued)

(56) References Cited

U.S. PATENT DOCUMENTS 9,850,873 B2    12/2017 Henley
10,532,661 B2    1/2020 Schwartz et al.
(Continued)

FOREIGN PATENT DOCUMENTS

KR    10-2017-0037279    4/2017

OTHER PUBLICATIONS

Zhang et al. "Automatic Detection and Management System of Vehicle Heater Based on CAN Bus," 2015 IEEE International Conference on Mechatronics and Automation (ICMA), 2015, pp. 185-189, doi: 10.1109/CMA.2015.7237479, Beijing, China.
(Continued)

*Primary Examiner* — Nitin C Patel
(74) *Attorney, Agent, or Firm* — Sterne, Kessler, Goldstein & Fox P.L.L.C.

(57) ABSTRACT

Systems, methods, and computer-readable media are disclosed for a systems and methods for improved LIDAR return light capture efficiency. One example method may include comparing, by a controller including a processor and at a first time, a first temperature of a first computing element to a first threshold temperature and a second temperature of a second computing element to a second threshold temperature. The example method may also include sending, based on a determination that the first temperature is below the first threshold temperature and the second temperature is above the second threshold temperature, a first signal to a switch to activate a data output corresponding to the second computing element. The example method may also include sending, to the second computing element, a second signal to cause a third computing element to increase heat dissipation from the third computing element to the first computing element. The example method may also include receiving, from the first computing element, a third temperature of the first computing element at a second time. The example method (Continued)

may also include comparing the third temperature of the first computing element to the first threshold temperature. The example method may also include determining that the third temperature of the first computing element is at or above the first threshold temperature at the second time. The example method may also include sending, based on a determination that that the third temperature is at or above the first threshold temperature, a third signal to the switch to activate a data output corresponding to the first computing element.

20 Claims, 10 Drawing Sheets

(51) Int. Cl.
 *G06F 1/20* (2006.01)
 *G01S 17/931* (2020.01)
 *H05K 7/20* (2006.01)
(58) Field of Classification Search
 CPC ............ G06F 11/3058; G05B 19/4155; G05B 2219/49216; G01S 17/931; H05K 7/20854; B60L 1/02; B60L 3/0084; B60L 2270/44
 See application file for complete search history.

(56) References Cited

U.S. PATENT DOCUMENTS

| | | |
|---|---|---|
| 2003/0099055 A1 | 5/2003 | Kim et al. |
| 2007/0272678 A1 | 11/2007 | Meyuchas et al. |
| 2012/0166839 A1 | 6/2012 | Sodhi et al. |
| 2013/0227261 A1 | 8/2013 | Anderson et al. |
| 2015/0217623 A1 | 8/2015 | Hatakeyama et al. |
| 2016/0200172 A1 | 7/2016 | Nakashima et al. |
| 2017/0111520 A1 | 4/2017 | Bowers et al. |
| 2018/0229620 A1 | 8/2018 | Yamanaka |
| 2018/0257457 A1 | 9/2018 | Olson et al. |
| 2019/0286800 A1 | 9/2019 | Ho et al. |
| 2019/0384354 A1 | 12/2019 | Badinski et al. |
| 2020/0319700 A1 | 10/2020 | Wu et al. |

OTHER PUBLICATIONS

M. H. Salah, et al., "Nonlinear-Control Strategy for Advanced Vehicle Thermal-Management Systems," in IEEE Wransactions on Vehicular Technology, Jan. 2008, pp. 127-137, vol. 57, No. 1, doi: 10.1109/TVT.2007.901892, Clemson University TigerPrints, United States.

International Search Report and Written Opinion of the International Searching Authority directed to related International Patent Application No. PCT/US2021/063297, dated Apr. 7, 2022; 10 pages.

SYSTEMS AND METHODS FOR HEATING COMPUTING ELEMENTS IN VEHICLES

RELATED APPLICATION

This application is a continuation of U.S. patent application Ser. No. 17/121,107, filed Dec. 14, 2020, now U.S. Pat. No. 11,422,534 issued on Aug. 23, 2022, which is incorporated herein by reference in its entirety.

BACKGROUND

In some vehicle systems (for example, in autonomous vehicles that include several computing elements used to perform the processing necessary for autonomous functions of the vehicle), the computing elements of the vehicle may be associated with threshold operating temperatures that they must be at before they can be used. In some cases, some of the computing elements (for example, a host central processing unit (CPU)) may be associated with a higher threshold operating temperature than other computing elements within the vehicle. For example, a first computing element may need to be at a temperature of zero degrees Celsius before it may be used and a second computing element may only need to be at a temperature of −40 degrees Celsius to operate. This may potentially be problematic if a user desires to use the vehicle, but any current temperature of the computing elements with the higher threshold operating temperature are below their threshold operating temperature. The user may have to wait for the computing elements with the higher threshold operating temperature to warm up and reach their threshold operating temperature before they may be used. This may potential take up to 60 minutes or longer.

BRIEF DESCRIPTION OF THE DRAWINGS

The detailed description is set forth with reference to the accompanying drawings. The drawings are provided for purposes of illustration only and merely depict example embodiments of the disclosure. The drawings are provided to facilitate understanding of the disclosure and shall not be deemed to limit the breadth, scope, or applicability of the disclosure. In the drawings, the left-most digit(s) of a reference numeral may identify the drawing in which the reference numeral first appears. The use of the same reference numerals indicates similar, but not necessarily the same or identical components. However, different reference numerals may be used to identify similar components as well. Various embodiments may utilize elements or components other than those illustrated in the drawings, and some elements and/or components may not be present in various embodiments. The use of singular terminology to describe a component or element may, depending on the context, encompass a plural number of such components or elements and vice versa.

DETAILED DESCRIPTION

Overview

Figure 1:
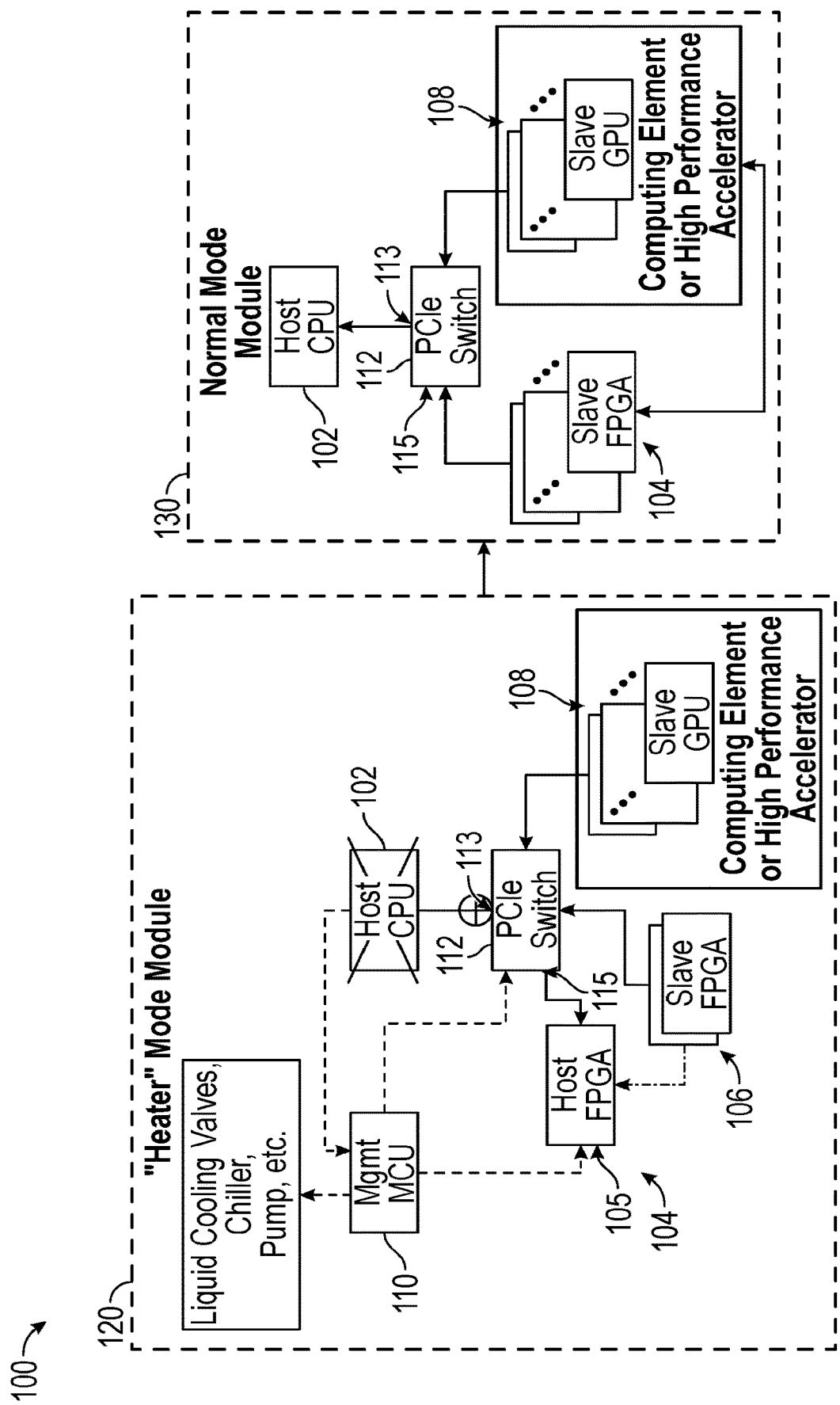
FIG. 1 depicts a schematic illustration of an example system architecture, in accordance with one or more example embodiments of the disclosure.

This disclosure relates to, among other things, systems and methods for heating computing elements in vehicles. In some cases, this disclosure may also relate to systems and methods for recycling heat produced by computing elements in vehicles for other purposes as well for example, to heat a cabin of the vehicle). In some cases, a computing element may include any component within the vehicle that may be used to perform processing tasks for the vehicle (for example, a CPU, graphics processing unit (GPU), or field programmable gate array (FPGA), among other types of accelerators or computing elements). More particularly, the systems and methods described herein may be used to heat certain computing elements of vehicles, such as autonomous vehicles, that may be required to be above a threshold temperature in order to properly operate. In some cases, such as with autonomous vehicles, it may be important for such computing elements to be operational for the vehicle to be functional because autonomous vehicles may rely more so (or entirely so) on the computing systems to operate as opposed to conventional non-autonomous vehicles that may rely more on driver input to operate. For consistency sake, this description may refer to heating the "host CPU," however, it should be noted that the systems and methods may be applied to any other type of computing element as well. The host CPU may be a computing element that is used by the vehicle to perform autonomous or semi-autonomous vehicle functionality. For example, the host CPU may be a main CPU used to perform processing tasks necessary for an autonomous vehicle system to carry out autonomous vehicle functionality in an autonomous vehicle (or semi-autonomous vehicle functionality) Additionally, it should be noted that these same systems and methods may be used in contexts beyond autonomous vehicles as well (for example, semi-autonomous vehicle, vehicles without autonomous or semi-autonomous functionality, or even for purposes unrelated to vehicles, such as any other type of system that includes components that have a minimum temperature requirement for proper operation). The systems and methods described herein may also include applications beyond the heating of vehicle computing elements. For example, the systems and methods may be used to address humidity that may arise in a vehicle. As a second example, the heat generated may be used to provide heat to a cabin of the vehicle. As a third example, the heat generated may be provided to other vehicle components (even including vehicle components that may not necessarily be computing elements) through a dedicated coolant loop, and may be used to regulate the temperature of those vehicle components as well.

In some embodiments, the systems and methods described herein may include a number of benefits. As mentioned above, certain vehicle computing elements (for example, a host CPU of the vehicle) may need to be at or above a threshold temperature before they may be operated. In some situations, such as when a vehicle remains unused in a cold environment for a period of time, the computing elements of the vehicle may drop to below their associated operating temperature thresholds due to the low ambient temperature of the environment around (and/or within) the vehicle. Consequentially, these computing elements may not initially be operational when a user desires to use the vehicle (for example, after an activation sequence). An activation sequence may depend on the type of vehicle. For example, if the vehicle is an electric vehicle, the activation sequence may include one or more actions taking place prior to a user using the vehicle, including, for example, the vehicle being turned on and/or the computing system of the vehicle receiving a request to turn on. If the vehicle includes an internal combustion engine, then the activation sequence may refer to an activation event of the vehicle, such as a cranking of the vehicle. This may potentially be problematic because if the vehicle includes semi or fully-autonomous functionality, the computing elements may be important or necessary for the vehicle to function. The systems and methods described herein may remedy this issue by more rapidly heating these computing elements to their operating temperature, so that the vehicle may then be able to use those computing elements (for example, to perform semi-autonomous or fully-autonomous vehicle functions). Additionally, as aforementioned, the heat generated in order to heat the host CPU to its operational temperature may be scavenged for use in other areas of the vehicle as well, such as to heat vehicle components other than computing elements. This may reduce the workload of other heating, ventilation, and air conditioning (HVAC) vehicle systems that may otherwise be used to heat these other vehicle components, or may also serve to provide heat to other vehicle components that would not normally be heated by any conventional vehicle system.

Figure 7:
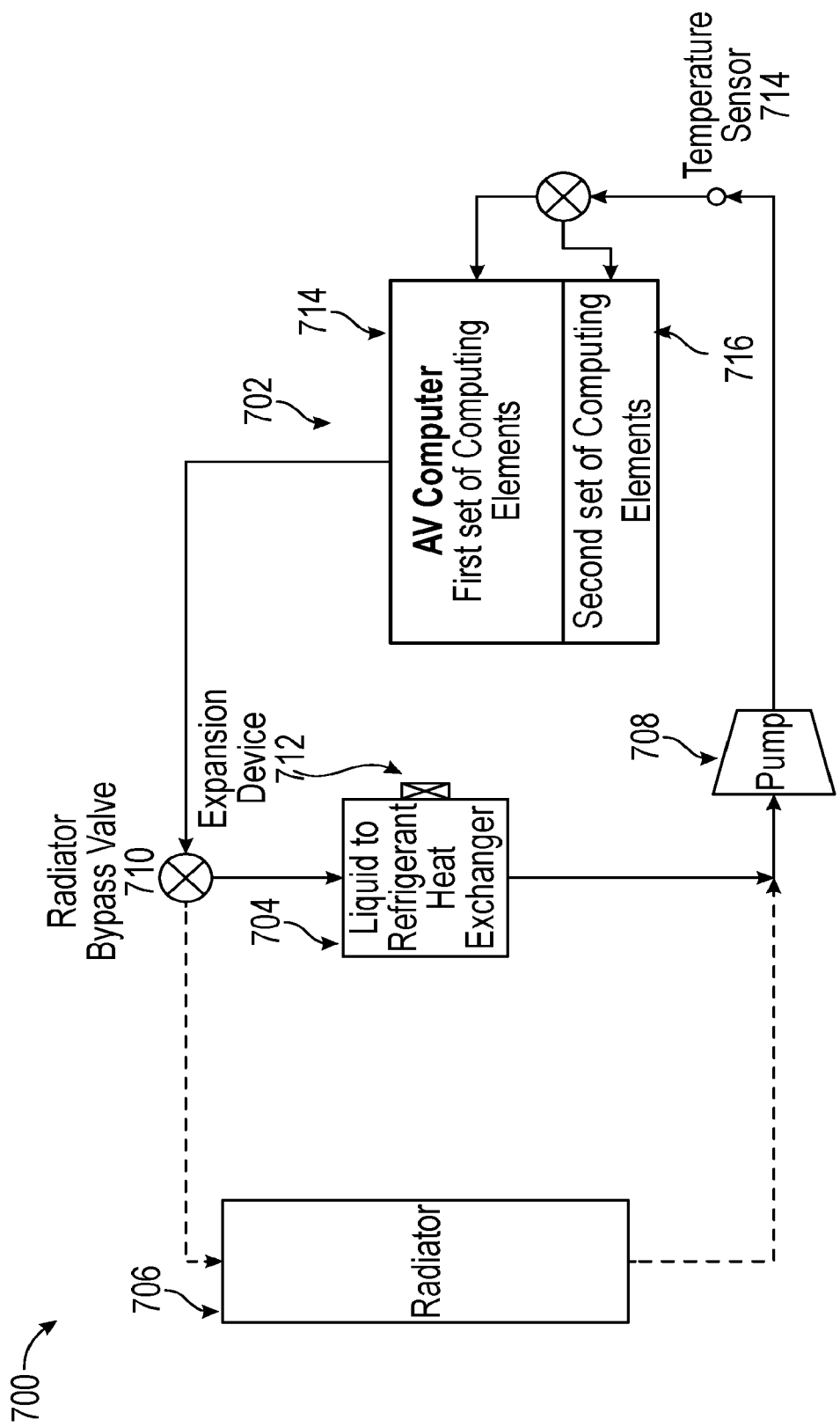
FIG. 7 depicts a schematic illustration of an example system architecture, in accordance with one or more example embodiments of the disclosure.

In some embodiments, the systems and methods described herein may serve to increase the temperature of the host CPU (or any other computing element) at a more rapid rate by loading nearby computing elements (for example, increasing the processing load of the nearby computing elements) that are capable of operating at below the operating temperature of the host CPU (for example, as depicted in FIG. 1) to cause them to dissipate heat towards the host CPU. That is, these computing elements of the vehicle may have operating temperatures that are much lower than the operating temperature of the host CPU (for example, some computing elements may be capable of operating in temperatures as low as −40 degrees Celsius, whereas the host CPU may be capable of operating at temperatures at or above 0 degrees Celsius). As a result of this, these computing elements may be utilized before the host CPU reaches its operating temperature. Performing processing tasks with these computing elements may naturally cause the computing elements to dissipate some heat, and this heat may correspondingly be used to increase the temperature of the host CPU. The heat generated by the computing elements may dissipate from the computing elements, for example, through the air, and may be directed towards the host CPU, which may absorb some of this heat. This may allow the host CPU to be heated to its operating temperature much quicker than if these computing elements were to operate under a normal processing load because less heat may be dissipated by these computing elements under a normal processing load. This may be undesirable for a user of the vehicle because they may need to wait a longer period of time before certain vehicle functionalities are available for use (for example, functionality that may rely on the host CPU). In some embodiments, the host CPU may also be heated through mediums other than the air, such as through the use of a heated liquid loop (for example, as shown in FIG. 7, as well as any other figure described herein) or solid heat sink element that may be used to transfer heat from the computing elements to the host CPU.

In some embodiments, the computing elements that are selected for loading (for example, increasing a processing load) may vary depending on a number of factors. For example, certain computing elements may be selected that are within a particular distance of and/or in contact directly or indirectly with the host CPU. As a second example, the number of computing elements within a particular distance from the host CPU may be a determinative factor. For example, if fewer computing elements are located within a certain distance from the host CPU, then a larger number of computing elements may be loaded to increase the likelihood that the heat will reach the host CPU. If there are a larger number of computing elements within the particular distance from the host CPU, then it may be much more likely that the heat from any given computing element will reach the host CPU, and thus fewer computing elements may be required in these cases. The computing elements selected for loading may also depend on the processing capabilities of different types of computing elements. For example, some computing elements may have higher processing capabilities, and thus may be capable of emitting greater amounts of heat at a given processing load. If computing elements with higher processing capabilities are selected then, in some cases, fewer computing elements may need to be heated than if the computing elements were to have lower processing capabilities and would dissipate lower amounts of heat. In some cases, all of the computing elements of the vehicle may be loaded at the same time. In some cases, the computing elements that are selected may also depend on the determined temperature of the host CPU. For example, if the host CPU's current temperature is much lower than its operating temperature, then more computing elements may be selected for loading, whereas if the host CPU's current temperature is closer to its operating temperature, then fewer computing elements may be loaded. In some cases, the number and/or types of computing elements that are loaded may also be dynamic. For example, a first number of computing elements may be initially loaded and some of the computing elements may be instructed to return to normal loading as the host CPU's temperature progresses towards its threshold operating temperature.

In some embodiments, the system used to heat the host CPU by loading other computing elements in the vehicle may include at least a management controller, one or more FPGAs (which, for example, may be configurable to include one or more host FPGAs and/or one or more slave FPGAs), a switch (for example, a peripheral component interconnect express (PCIe) switch), one or more GPUs, and one or more temperature sensors. As aforementioned, for the sake of simplicity, the host CPU may be used as the example computing element that may need to be heated to a particular threshold temperature before it may be operated (the computing elements with a higher threshold operating temperature than some of the other computing elements). However, any of the other elements included within the system, or even other computing elements included within the vehicle but not mentioned as being included within this system, may be the computing element that is heated using this system.

In some embodiments, the management controller may be a controller used to control some or all of the other computing elements in the system (for example, the FPGAs, the switch, and/or the GPUs). In some cases, the management controller may not be configured to control all of the computing elements in the system, but may nevertheless be in communication with all of the computing elements (for example, the management controller may not necessarily control the host CPU, but may still send and/or receive data to and/or from the host CPU). However, in other cases, the management controller may alternatively be configured to control and/or communicate with any of the computing elements in the system. The management controller may be configured to provide commands (for example, sending a data signal to a computing element with an instruction) to any of the other computing elements in the system. The management controller may also be configured to receive data from the other computing elements in the system, and may use this data to determine what commands to provide to the other computing elements. For example, temperature sensors within the system may be used to provide data regarding the current temperature of the various other computing elements to the management controller. These temperature sensors may be mounted on or within the computing elements (for example, on or within printed circuit boards (PCBs) of the computing elements, as well as any other portion of the computing elements), or may alternatively be located externally to the computing elements. As a more specific example, a portion of the data received by the management controller may include temperature readings of the host CPU.

In some embodiments, the management controller may be one of the computing elements that is capable of operating at lower temperatures than the host CPU. Upon initialization (for example, upon an activation sequence of the vehicle, or, alternatively, at any other time) the management controller may query the host CPU to determine its current temperature. Based on these readings, the management controller may determine whether the host CPU is within its threshold operating temperature (for example, at or above the minimum temperature that the host CPU may need to be at to be operational). If the host CPU is not yet within its operating temperature, then the management controller may send one or more commands that may cause the other computing elements to dissipate heat to accelerate the temperature increase of the host CPU. That is, the host CPU may send one or more commands for the other computing elements to increase their processing load, which may naturally result in a greater heat dissipation from the computing elements. In some instances, the processing load of the computing elements may be increased to the maximum processing capacity of the computing elements (which may differ between different computing elements), however, any percentage of the maximum processing load a given computing element may also be used as well. In some cases, the management controller may also receive information from the other computing elements being loaded, and may use this information to determine further instructions to provide to the other computing elements. For example, if the temperature of a given computing element is determined to be too high, which may potentially cause damage to the computing element, then the management controller may instruct the computing element to reduce its processing load and thus reduce its heat dissipation. This is just one non-limiting example of how a management controller may use the data received from the other computing elements, and the data may also be used in any other number of ways. If the host CPU is within its operating temperature, then the management controller may send one or more commands for the computing elements to return to a normal processing load. As will be described below, these commands may also involve the reconfiguration of one or more of the computing elements to serve this purpose.

In some embodiments, the computing elements within the vehicle system that may be used for purposes of dissipating heat to increase the temperature of the host CPU may include the one or more accelerators (for example, one or more FPGAs or GPUs). The vehicle system may use a PCIe or other similar master slave communication protocol, with the FPGAs and GPUs serving as end points or slaves in the PCIe interface. In the scenarios described herein the host CPU may serve as the PCIe master device unless it is below its threshold operating temperature. In this case, then one or more of the FPGAs may be configured as a host FPGA to serve as the master in place of the host CPU until the host CPU is able to reach its threshold operating temperature. The remaining FPGAs (the FPGAs not selected to be the master) may be used as PCIe end points that may be controlled by the master FPGA to provide heat to the host CPU (for example, in conjunction with other end point devices in the vehicle system, such as the GPUs) by increasing the processing load of the end points. It should also be noted that while FPGAs and GPUs are described as being used as the end points in the PCIe interface that may be for producing heat to heat the host CPU, any other type of computing element may similarly be used other than FPGAs or GPUs. Additionally, any master-slave protocol other than PCIe may also be used as well. Configuring a FPGA as a host FPGA or a slave FPGA may be performed using the switch. The switch may be, for example, a PCIe switch and may be capable of switching between different upstream ports located on the switch. PCIe may be an interface standard for connecting high-speed computing elements. One port of the switch may be connected to the host CPU and one or more ports of the switch may be connected to one or more FPGAs (or alternatively, a single FPGA may be assigned as a host FPGA and the switch may only include one port to that particular FPGA). The switch may be controlled by the management controller, such that the management controller may provide commands to the switch to switch its upstream port from the host CPU to a FPGA, or vice versa. In other words, the switch may be used provide control of the FPGAs to a designated host FPGA when the host CPU is below its operating temperature, and then may be used to provide control over the FPGAs back to the host CPU once it is heated to its operational temperature and can be used. The main source of heat dissipation used to heat the host CPU towards its operating temperature may be the GPUs (because of their high processing power), however, any other computing element may similarly provide heat dissipation to heat the host CPU as well.

In some embodiments, the system used to heat the host CPU by loading other computing elements in the vehicle may be associated with two modes of operation: a heating mode and a normal mode. During an activation sequence, the management controller may query other computing elements within the system for data, such as their current temperature. If the management controller determines that the temperature of the host CPU is below its operating threshold, the management controller may initiate a "heating" mode. During this heating mode, the management controller may provide commands to the switch to switch to an upstream port connected to an FPGA instead of the host CPU. The management controller may also provide commands to that FPGA to serve as a host FPGA for the duration of the heating mode. The remaining FPGAs may be configured as slave FPGAs, which may be a default mode of operation for the FPGAs. While in this heating mode, the host FPGA may provide instructions to the slave FPGAs and to the GPUs (as well as any other end point devices in the PCIe interface) to increase their processing load and cause heat dissipation. The resulting heat dissipation (for example, through the air, through a heated liquid coolant line, a solid heat sink, or any other heat transfer medium) from the slave FPGAs, GPUs, and/or any other end point devices may then serve to heat the host CPU. During this heating mode, the management controller may, at particular intervals, query the temperature sensor of the host CPU to determine changes in the temperature of the host CPU. When the management controller determines that the host CPU has reached and/or crossed its threshold temperature of operation, the management controller may return the system to a "normal" mode of operation. During this normal mode of operation, the management controller may provide an instruction to the switch to switch to an upstream port connected to the host CPU instead of the host FPGA. This may allow the host CPU to take over control over the computing elements now that it is within its operating temperature. The FPGA that was the host FPGA may then be reconfigured as another slave FPGA along with the other slave FPGAs (that is, all of the FPGAs may now receive instruction from the host CPU instead of some of the FPGAs receiving instruction from a host FPGA). The computing elements may then be used for their normal processing tasks (for example, processing sensor data from the vehicle) at their normal processing loads (which may be lower processing loads than the processing loads using to dissipate heat in order to rapidly heat the host CPU). Additionally, the heating mode may not always be initiated at every activation sequence of the vehicle. For example, if the ambient environment around the vehicle is not cold, the management controller may query the host CPU and determined that is it within its operating temperature even at the time of the activation sequence. In this case, the heating mode may be altogether avoided, and the vehicle may simply initiate in the normal mode of operation.

In some embodiments, the heat generated by the system used to heat the host CPU may be used for other purposes within the vehicle as well. For example, this heat may be used in a dedicated coolant loop (for example, as depicted in FIGS. 2-7) that may provide heated refrigerant to other areas of the vehicle, such as other vehicle components besides the computing elements described above. This coolant loop may be a separate loop from any existing coolant loops in the vehicle (for example, if the vehicle is an internal combustion engine vehicle, the coolant loop described herein may be separate from the coolant loop used to provide coolant to the engine of the vehicle). A first example of such a coolant loop configuration (which may be depicted in FIG. 2) may include one or more other vehicle components, a computing system (which may be the system described above including the management controller, host CPU, FPGAs, GPUs, and the switch), a radiator, a chiller, a pump, and one or more bypass valves. In some instances, the other vehicle components may include any components in addition to the computing elements that may benefit from temperature regulation (for example, inverters, high voltage batteries, other electronic loads, etc.). As may be seen in FIG. 2, the coolant loops may flow from the computing elements to the other vehicle components, such that the heat produced by the computing elements to increase the temperature of the host CPU (as well as heat naturally produced by the computing elements even after the host CPU is heated to its threshold operating temperature) may be provided to the other vehicle components through heated refrigerant that may flow through the coolant loop connecting the two. In terms of other elements included in this first example coolant loop, the pump (for example, a heat pump) may serve to absorb heat from an external source and compress it into high-temperature heat. Heat pumps may be beneficial in electric vehicles that run using a battery rather than internal combustion because they may perform heating based on a temperature difference between refrigerant an external source. Other types of conventional heating system may use resistive heating elements, which may require energy to produce heat, resulting in a battery of the vehicle being drained faster (which may be especially detrimental in electric vehicles, as this may reduce the range of the electric vehicle). The radiator may be a component used to remove heat from the refrigerant flowing through the coolant to prevent its temperature from increasing by an undesirable amount. The refrigerant in the coolant loop may flow through the radiator, and air external to the vehicle may flow through the radiator and cool the refrigerant as it flows through the radiator. On a particularly hot day, the radiator may not provide the same cooling benefits because the air may be too hot to reduce the temperature of the refrigerant flowing through the radiator as effectively. When this is the case, a radiator bypass valve may be used to bypass the coolant path to the radiator, and instead direct it through the chiller. The chiller may be a component that uses refrigerant systems in the vehicle to cool the refrigerant flowing through the coolant loop. The radiator bypass valve may similarly be used on very cold days (for example, to avoid the refrigerant from flowing through the radiator and being cooled too much by the cold air flowing through the radiator). However, when this is the case, the chiller also may not be used, so the radiator bypass valve may simply serve to allow the refrigerant to bypass the radiator and avoid an undesirable decrease in temperature. The radiator bypass valve may be located after the other vehicle components in the coolant loop, and there also may exist a second bypass valve (the heated bypass valve) before the other vehicle components in the coolant loop. The heated bypass valve may be used to allow the refrigerant in the coolant loop to bypass the other vehicle components instead of flowing through the other vehicle components. This may be desirable if the other vehicle components are already at an optimal operating temperature, or the refrigerant in the coolant loop would either cool the devices to an undesirably cold temperature or would heat the devices to an undesirably hot temperature. This coolant loop may effectively use the heat generated by the computing elements to supplement the regulation of temperature control of other components in the vehicle, making this regulation more efficient by reducing the workload on (or completely replacing) separate systems used to heat the other vehicle components.

Figure 3:
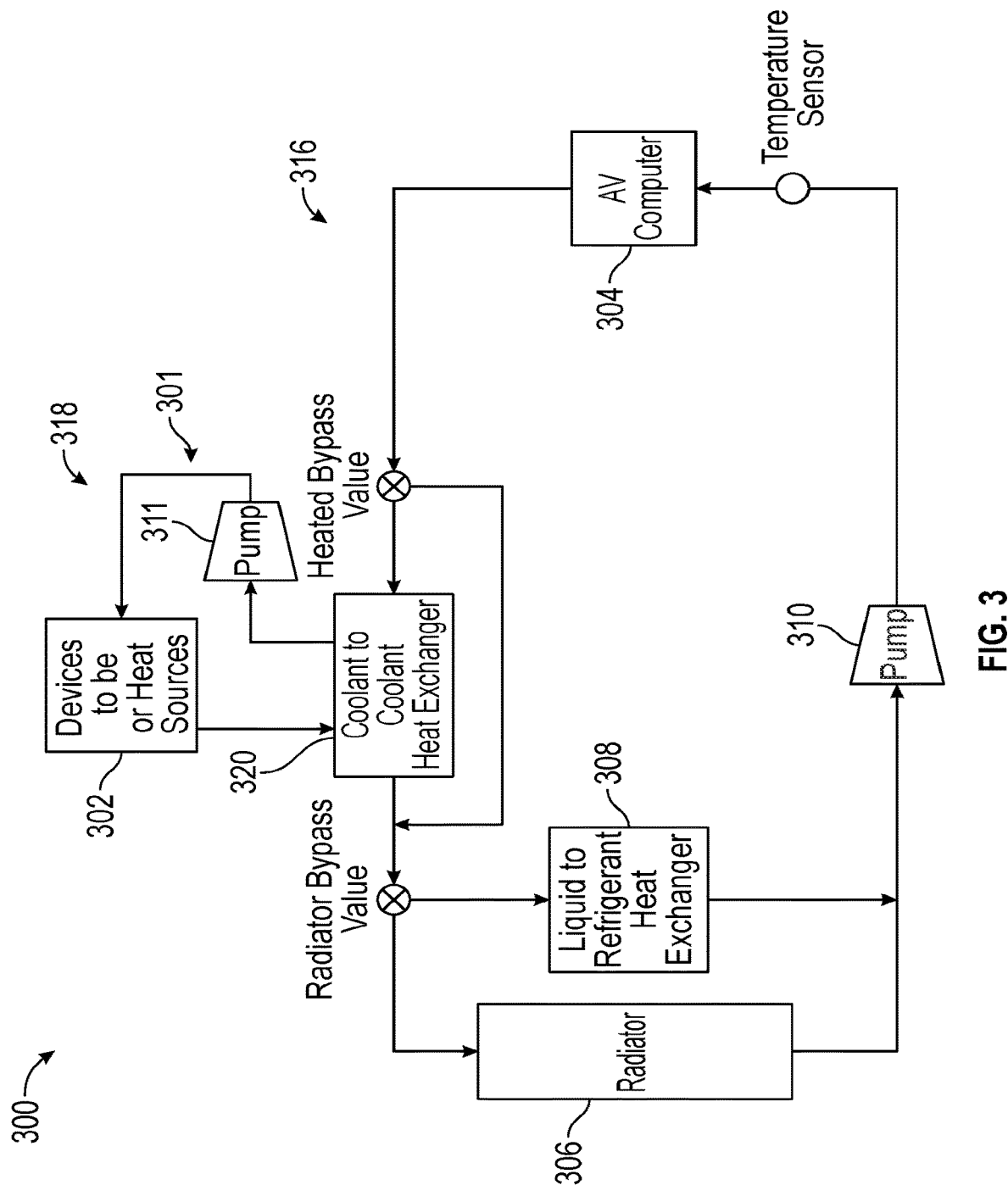
FIG. 3 depicts a schematic illustration of an example system architecture, in accordance with one or more example embodiments of the disclosure.

In some embodiments, a second example of a coolant loop employed for regulation of temperature of other components of the vehicle (for example, as depicted in FIG. 3) may include some of the same elements as the first example of the coolant loop. That is, the second example of the coolant loop may include a radiator, a chiller, a pump, one or more bypass valves, the computing system, and one or more devices to be heated. The second example coolant loop may differ from the first example coolant loop in that the second example coolant loop may include the other vehicle components (that may be heated using the heat from the computing system) in a separate loop from the loop including the radiator, chiller, and computing system. That is, a heat exchanger may be located in the position in the second coolant loop where the other vehicle components would be in the first example coolant loop. The separate loop may also include a second pump to direct the flow of coolant within the separate loop. This second example coolant loop configuration may be beneficial in that one cooling loop may be used as a backup for the other as a failsafe. The coolant heat exchanger may allow heat to move from one loop to another.

Figure 4:
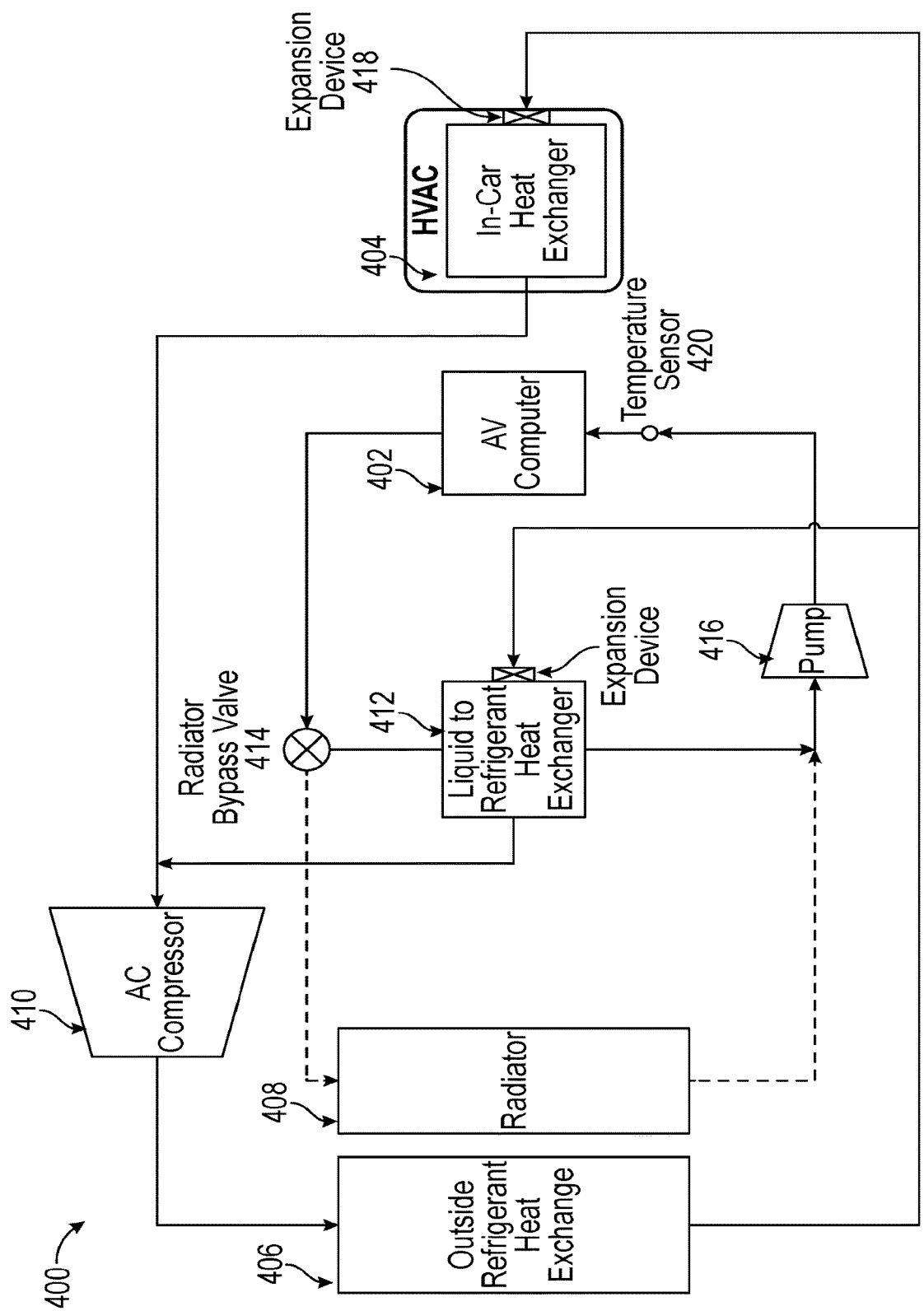
FIG. 4 depicts a schematic illustration of an example system architecture, in accordance with one or more example embodiments of the disclosure.

In some embodiments, a third example of a coolant loop (for example, as depicted in FIG. 4) may be used to provide the generated heat to heat or supplement the heating of the cabin of the vehicle. In some embodiments, this third example coolant loop may include a radiator, a first heat exchanger (which may be an outside heat exchanger) with first expansion device, a second heat exchanger with a second expansion device, a pump, a computing system (which may be the same as the system described with respect to FIG. 1), or more temperature sensors, a bypass valve, an air conditioning (AC) compressor, and a vehicle HVAC system, where the vehicle HVAC system may further include a third heat exchanger (which may be an in-vehicle heat exchanger). The second heat exchanger may receive the heat generated by the computing system (for example, the heat generated in order to increase the temperature of the host CPU). This heat may then be provided to the third heat exchanger within the vehicle. In effect, the addition of the second heat exchanger to receive the resulting heat from the computing system may serve to supplement the energy created by the outside heat exchanger. This may consequentially reduce the amount of work required to be performed by the AC compressor to achieve the same in-cabin temperature for the vehicle because the supplemental heat is being provided by the second heat exchanger. Additional examples of configurations in which heat generated by the computing system may be used in other parts of the vehicle may also be depicted in FIGS. 5-7 as well, which may be described in more detail below.

Turning to the figures, FIG. 1 depicts a schematic illustration of an example system 100 architecture, in accordance with one or more example embodiments of the disclosure. The system 100 may be used to heat a host CPU 102 (or any other computing element) through heat dissipation by nearby computing elements (for example one or more FPGAs 104 and/or one or more GPUs 108, as well as any other types of computing elements). In some embodiments this system 100 may include at least the host CPU 102 a management controller 110, one or more FPGAs 104 (which, for example, may be configurable to include one or more host FPGAs 105 and/or one or more slave FPGAs 106), a switch 112 (for example, a PCIe switch), one or more GPUs 108, and/or one or more temperature sensors (not shown in the figure). As aforementioned, for the sake of simplicity, the host CPU 102 may be used herein as the example computing element that needs to be heated to a particular threshold temperature before it may be operated. However, any of the other elements included within the system 100, or even other computing elements included within the vehicle but not mentioned as being included within this system, may be the computing element that is heated using this system 100.

In some embodiments, the management controller 110 may be a controller used to control some or all of the other computing elements in the system (for example, the FPGAs 104, the switch 112, and/or the GPUs 108). In some cases, the management controller 110 may not be configured to control all of the computing elements in the system, but may nevertheless be in communication with all of the elements (for example, the management controller 110 may not necessarily control the host CPU 102, but may still send and/or receive data to and/or from the host CPU 102). To this end, the management controller 110 may be configured to provide commands (for example, using a data signal) to any of the other computing elements in the system. The management controller 110 may also be configured to receive data from the other computing elements in the system, and may use this data to determine what commands to provide to the other computing elements. For example, temperature sensors within the system may be used to provide data regarding the current temperature of the various other computing elements to the management controller 110. These temperature sensors may be mounted on or within the printed circuit boards (PCBs) comprising the computing elements, or may alternatively be located externally to the computing elements. As a more specific example, a portion of the data received by the management controller 110 may include temperature readings of the host CPU 102. The management controller 110 may be one of the computing elements that is capable of operating at lower temperatures than the host CPU 102. When an activation sequence is performed, the management controller 110 may query the host CPU 102 to determine its current temperature. Based on these readings, the management controller 110 may determine whether the host CPU 102 is within its operating temperature (for example, at or above the minimum temperature that the host CPU 102 may need to be at to be operational). If the host CPU 102 is not yet within its operating temperature, then the management controller 110 may send one or more commands that cause the other computing elements to dissipate heat to accelerate the heating of the host CPU 102. That is, the host CPU 102 may send one or more commands for the other computing elements to increase their processing load to increase heat production by the other computing elements. In some instances, the processing load of the computing elements may be increased to the maximum processing capacity of the computing elements (which may differ between different computing elements), however, any percentage of the maximum processing load a given computing element may also be used as well. If the host CPU 102 is within its operating temperature, then the management controller 110 may send one or more commands for the computing elements to return to a normal processing load. As will be described below, these commands may also involve the reconfiguration of one or more of the computing elements to serve this purpose.

In some embodiments, the computing elements within the vehicle system that may be used for purposes of dissipating heat to increase the temperature of the host CPU 102 may include the one or more accelerators (for example, one or more FPGAs 104 or GPUs 108). The vehicle system may use a PCIe or other similar master slave communication protocol, with the FPGAs 104 and GPUs 108 serving as end points or slaves in the PCIe interface. In the scenarios described herein the host CPU 102 may serve as the PCIe master device unless it is below its threshold operating temperature. In this case, then or more of the FPGAs 104 may be configured as a host FPGA to serve as the master in place of the host CPU 102 until the host CPU 102 is able to reach its threshold operating temperature. The remaining FPGAs (the FPGAs not selected to be the master) may be used as PCIe end points that may be controlled by the master FPGA to provide heat to the host CPU 102 (for example, in conjunction with other end point devices in the vehicle system, such as the GPUs 108) by increasing the processing load of the end points. It should also be noted that while FPGAs 104 and GPUs 108 are described as being used as the end points in the PCIe interface that may be for producing heat to heat the host CPU 102, any other type of computing element may similarly be used other than FPGAs 104 or GPUs 108. Additionally, any master-slave protocol other than PCIe may also be used as well. Configuring a FPGA 104 as a host FPGA 105 or a slave FPGA may be performed using the switch 112. The switch 112 may be, for example, a peripheral component interconnect express (PCIe) switch and may be capable of switching between different upstream ports located on the switch 112. A first port 113 of the switch 112 may be connected to the host CPU 102 and a second port 115 of the switch 112 may be connected to one or more FPGAs 104 (or alternatively, a single FPGA 104 may be assigned as a host FPGA 105 and the switch 112 may only include one port to that particular FPGA). The switch 112 may be controlled by the management controller 110, such that the management controller 110 may provide commands to the switch 112 to switch its upstream port (for example, an input or output port of the switch used to transfer electrical signals to and/or from another component) from first port 113 connected to the host CPU 102 to the second port 115 connected a FPGA 104, or vice versa. In other words, the switch 112 may be used provide control of the FPGAs 104 to a designated host FPGA 105 when the host CPU 102 is below its operating temperature, and then may be used to provide control over the FPGAs 104 back to the host CPU 102 once it is heated to its operational temperature and can be used. The main source of heat dissipation used to heat the host CPU 102 towards its operating temperature may be the GPUs 108, however, any other computing element may similarly provide heat dissipation to heat the host CPU 102 as well.

In some embodiments, the system used to heat the host CPU 102 through heat dissipation may be associated with two modes of operation: a heating mode and a normal mode 130. During an activation sequence, the management controller 110 may query other computing elements within the system for data, such as their current temperature. If the management controller 110 determines that the temperature of the host CPU 102 is below its operating threshold, the management controller 110 may initiate a "heating" mode 120. During this heating mode 120, the management controller 110 may provide commands to the switch 112 to switch to an upstream port connected to an FPGA 104 instead of the host CPU 102. The management controller 110 may also provide commands to that FPGA to serve as a host FPGA 105 for the duration of the heating mode 120. The remaining FPGAs 104 may be configured as slave FPGAs 106, which may be a default mode of operation for the FPGAs 104. While in this heating mode, the host FPGA may provide instructions to the slave FPGAs and to the GPUs (as well as any other end point devices in the PCIe interface) to increase their processing load and cause heat dissipation. The resulting heat dissipation (for example, through the air, through a heated liquid coolant line, a solid heat sink, or any other heat transfer medium) from the slave FPGAs, GPUs, and/or any other end point devices may then serve to heat the host CPU. During this heating mode 120, the management controller 110 may, at particular intervals, query the temperature sensor of the host CPU 102 to determine changes in the temperature of the host CPU 102. When the management controller 110 determines that the host CPU 102 has reached and/or crossed its threshold temperature of operation, the management controller 110 may return the system to a "normal" mode of operation. During this normal mode 130 of operation, the management controller 110 may provide an instruction to the switch 112 to switch to an upstream port connected to the host CPU 102 instead of the host FPGA 105. This may allow the host CPU 102 to take over control over the computing elements now that it is within its operating temperature. The FPGA that was the host FPGA 105 may then be reconfigured as another slave FPGA along with the other slave FPGAs 106 (that is, all of the FPGAs 104 may now receive instruction from the host CPU 102 instead of some of the FPGAs receiving instruction from a host FPGA 105). The computing elements may then be used for their normal processing tasks (for example, processing sensor data from the vehicle). Additionally, the heating mode 120 may not always be initiated at every activation sequence of the vehicle. For example, if the ambient environment around the vehicle is not cold, the management controller 110 may query the host CPU 102 and determined that is it within its operating temperature even at the time of the activation sequence. In this case, the heating mode 120 may be altogether avoided, and the vehicle may simply initiate in the normal mode 130 of operation.

Figure 2:
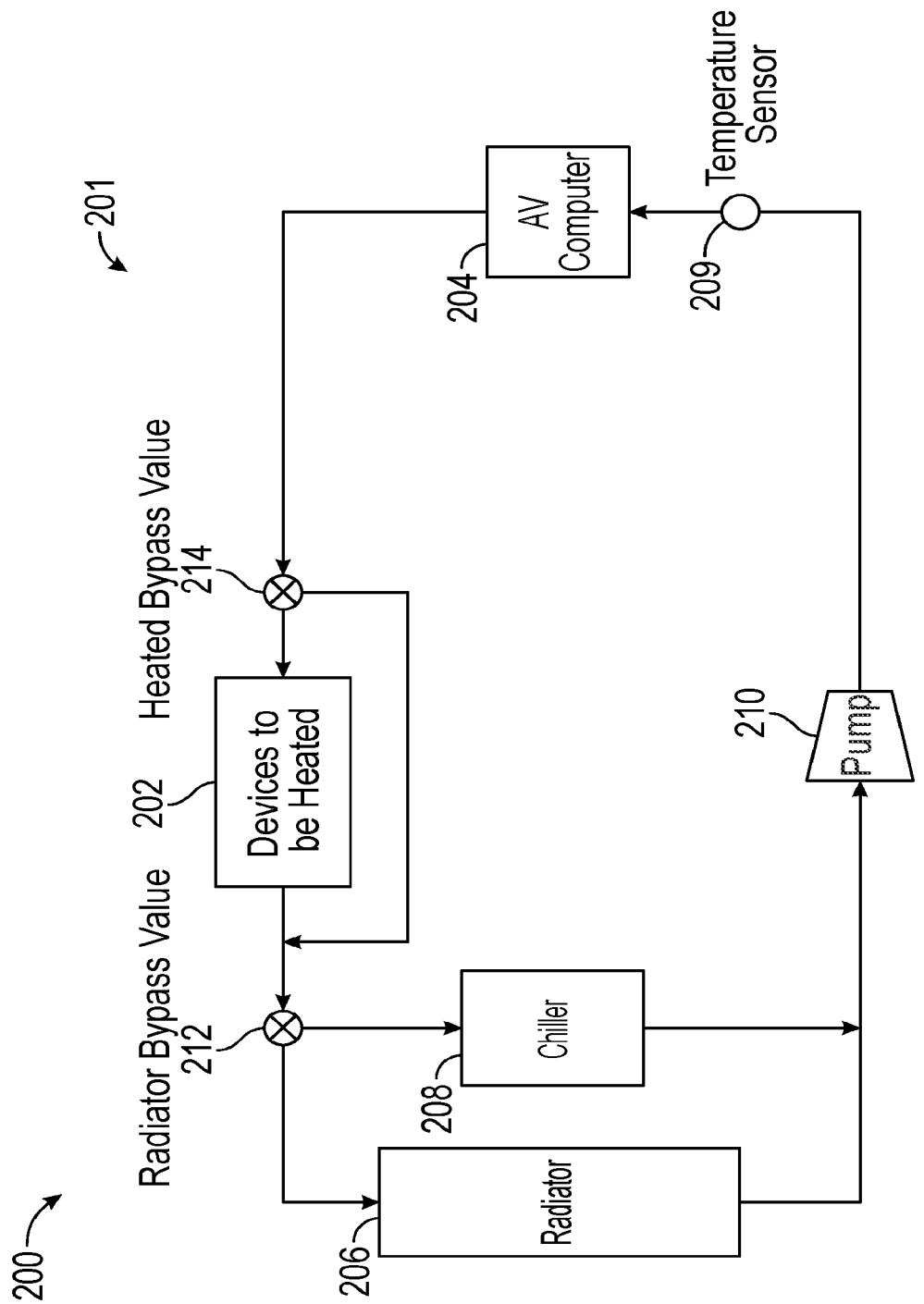
FIG. 2 depicts a schematic illustration of an example system architecture, in accordance with one or more example embodiments of the disclosure.

FIG. 2 depicts a schematic illustration of an example system 200 architecture, in accordance with one or more example embodiments of the disclosure. In some embodiments, the system 200 (which may also be referred to herein as coolant loop 201) may represent the first example of a coolant loop configuration configured to use the heat generated by the system 100 used to heat the host CPU 102 for other purposes within the vehicle. This coolant loop may be a separate loop from any existing coolant loops in the vehicle (for example, if the vehicle is an internal combustion engine vehicle, the coolant loop described herein may be separate from the coolant loop used to provide coolant to the engine of the vehicle).

In some embodiments, the coolant loop 201 may include one or more other vehicle components 202, a computing system 204 (which may be the system described above including the management controller, host CPU, FPGAs, GPUs, and the switch), a radiator 206, a chiller 208, a pump 210, and one or more bypass valves. In some instances, the other vehicle components 202 may include any components in addition to the computing elements that may benefit from temperature regulation (for example, inverters, high voltage batteries, other electronic loads, etc.). The coolant loop 201 may flow from the computing system 204 to the other vehicle components 202, such that the heat produced by the computing system 204 to heat the host CPU (as well as heat naturally produced by the computing elements even after the host CPU is heated to its threshold operating temperature) may be provided to the other vehicle components 202 through heated refrigerant that may flow through the coolant loop 201 connecting the two. In terms of other elements included in this first example coolant loop, the pump 210 (for example, a heat pump) may serve to absorb heat from an external source and compress it into high-temperature heat. Heat pumps may be beneficial in electric vehicles that run using a battery rather than internal combustion because they perform heating based on a temperature difference between refrigerant an external source. Other types of conventional heating system may use resistive heating elements, which may require energy to produce heat, resulting in the battery of the electric vehicle being drained faster. The radiator 206 may be a component used to remove heat from the refrigerant flowing through the coolant loop 201 to prevent its temperature from increasing by an undesirable amount. The refrigerant in the coolant loop 201 may flow through the radiator 206, and air external to the vehicle may flow through the radiator 206 and cool the refrigerant as it flows through the radiator 206. On a particularly hot day, the radiator 206 may not provide the same cooling benefits because the air may be too hot to reduce the temperature of the refrigerant flowing through the radiator as effectively. When this is the case, a radiator bypass valve 212 may be used to bypass the coolant path to the radiator 206, and instead direct it through the chiller 208. The chiller 208 may be a component that uses refrigerant systems in the vehicle to cool the refrigerant flowing through the coolant loop 201. The radiator bypass valve 212 may similarly be used on very cold days (for example, to avoid the refrigerant from flowing through the radiator 206 and being cooled too much by the cold air flowing through the radiator 206). However, when this is the case, the chiller 208 also may not be used, so the radiator bypass valve 212 may simply serve to allow the refrigerant to bypass the radiator 206 and avoid the refrigerant from decreasing in temperature by an undesirable amount. The radiator bypass valve 212 may be located after the other vehicle components 202 in the coolant loop 201, and there also may exist a second bypass valve 214 (the heated bypass valve) before the other vehicle components 202 in the coolant loop 201. The heated bypass valve 214 may be used to allow the refrigerant in the coolant loop 201 to bypass the other vehicle components 202 instead of flowing through the other vehicle components 202. This may be desirable if the other vehicle components 202 are already at an optimal operating temperature, or the refrigerant in the coolant loop 201 would either cool the other vehicle components 202 to an undesirably cold temperature or would heat the other vehicle components 202 to an undesirably hot temperature. This coolant loop 201 may effectively use the heat generated by the computing elements 204 to supplement the regulation of temperature control of other components in the vehicle, making this regulation more efficient by reducing the workload on (or completely replacing) separate systems that may normally be relied upon (if they even exist in the vehicle at all) to heat these other vehicle components 202.

FIG. 3 depicts a schematic illustration of an example system 300 architecture, in accordance with one or more example embodiments of the disclosure. In some embodiments, the system 300 (which may also be referred to herein as coolant loop 301) may represent the second example of a coolant loop configuration configured to use the heat generated by the system 100 used to heat the host CPU 102 for other purposes within the vehicle. The coolant loop 301 may include some of the same elements as the coolant loop 201 depicted in FIG. 2. That is, the coolant loop 301 may include a one or more vehicle components 302 (which may be vehicle components that may be heated using the heat generated by the system 100), a computing system 304 (which may be the system 100 described above including the management controller 110, host CPU 102, FPGAs 104, GPUs 108, and the switch 112), a radiator 306, a chiller 308, a first pump 310, a second pump 311, and one or more bypass valves (for example, a radiator bypass valve 312 and/or a heated bypass valve 314). The coolant loop 301, however, may differ from the coolant loop 201 in that the coolant loop 301 may include two distinct sub coolant loops within the overall coolant loop 301 (for example, a first coolant loop 316 and a second coolant loop 318). In some instances, the first coolant loop 316 may include the vehicle components 302 and a first pump 310, and the second coolant loop 318 may include the computing system 300, radiator 306, a chiller 308, a second pump 311, and one or more bypass valves (for example, a radiator bypass valve 312 and/or a heated bypass valve 314). The first coolant loop 316 and the second coolant loop 318 may also share a coolant to coolant heat exchanger 320. In some cases, the coolant to coolant heat exchanger 320 may be located in the position in the second coolant loop 318 where the vehicle components 202 would be located in the coolant loop 201, may also be connected to the first coolant loop 216, and may also be used to transfer heat between the first coolant loop 316 and the second coolant loop 318. This coolant loop 301 may be beneficial in that one coolant loop may be used as a backup for the other coolant loop as a failsafe.

FIG. 4 depicts a schematic illustration of an example system 400 architecture, in accordance with one or more example embodiments of the disclosure. In some embodiments, the system 400 may represent the third example of a coolant loop configuration. The system 400 may include at least a computing system 402 (which may be the system 100 described above including the management controller 110, host CPU 102, FPGAs 104, GPUs 108, and the switch 112), an in-car heat exchanger 404, an outside refrigerant heat exchanger 406, a radiator 408, a compressor 410, a liquid to refrigerant heat exchanger 412, a radiator bypass valve 414, and/or a pump 416. The in-car heat exchanger 404 and liquid to refrigerant heat exchanger 412 may also include an expansion device 418. Additionally, one or more temperature sensors 420 may be included within the system 400.

Figure 5:
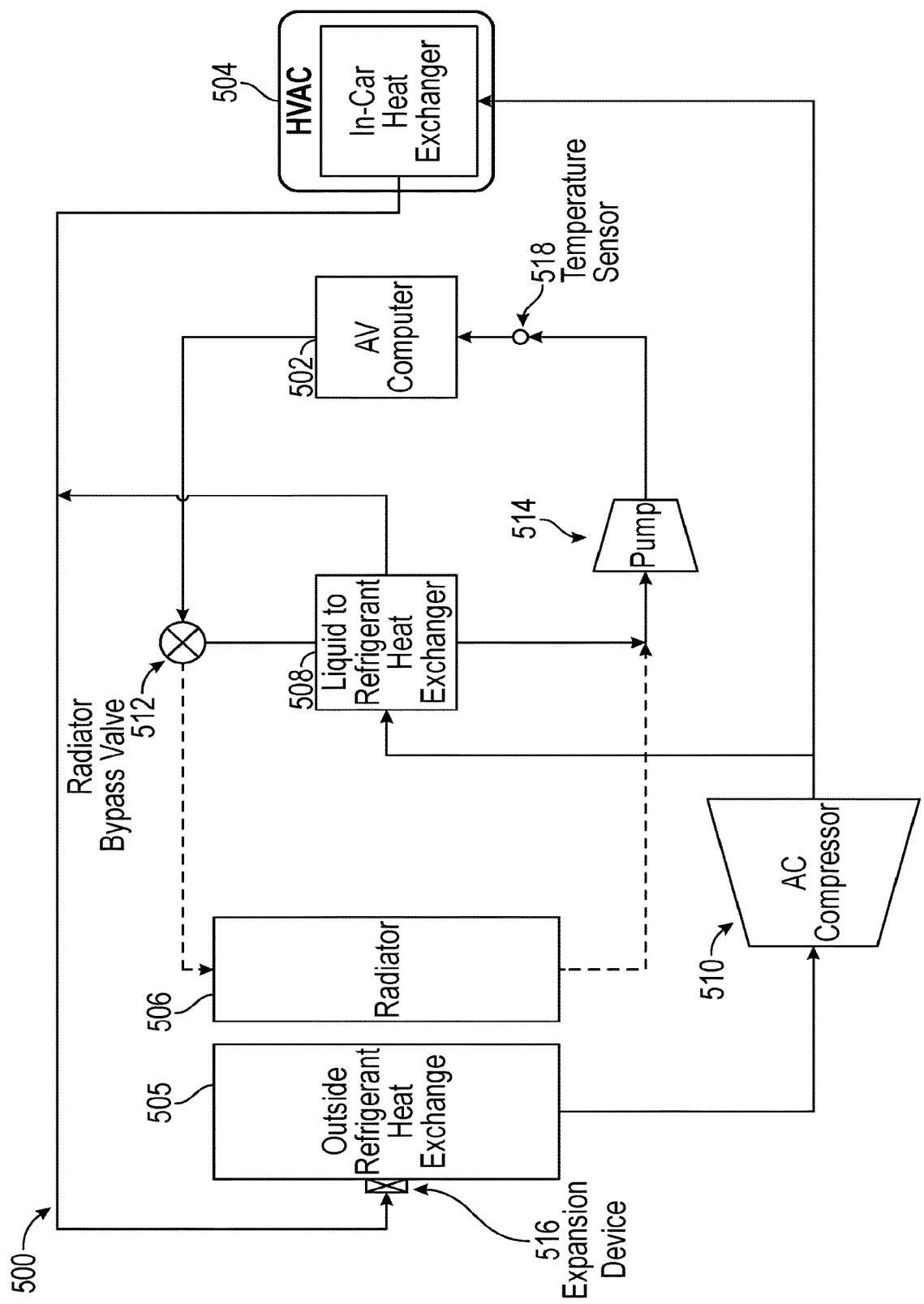
FIG. 5 depicts a schematic illustration of an example system architecture, in accordance with one or more example embodiments of the disclosure.

FIG. 5 depicts a schematic illustration of an example system 500 architecture, in accordance with one or more example embodiments of the disclosure. In some embodiments, the system 500 may represent the fourth example of a coolant loop configuration. The system 500 may include at least a computing system 502 (which may be the system 100 described above including the management controller 110, host CPU 102, FPGAs 104, GPUs 108, and the switch 112), an in-car heat exchanger 504, an outside refrigerant heat exchanger 505, a radiator 506, a liquid to refrigerant heat exchanger 508, a compressor 510, a radiator bypass valve 512, and/or a pump 514 (which may be a heat pump that may be found in particular types of vehicles, such as battery electric vehicle HAV systems). In some cases, the outside refrigerant heat exchanger 504 may also include an expansion device 516. Additionally, the system may also include one or more temperature sensors 518. In the system 500, the in-car heat exchanger 502 may serve as a condenser and the outside refrigerant heat exchanger 504 may serve as an evaporator. In the system 500, heat may be added to the refrigerant by the compressor 510 to heat the computing system 502. That is, the pump 514 in a vehicle including system 500 may be used as a source for heating the computing system 502. This system 500 may be useful for battery electric vehicles that are connected to a charging port while the vehicle remains unused (for example, overnight on a cold night). The pump 514 in the battery electric vehicle in this example may be used to pre-condition the temperature of the computing system 502 (rather than using a resistive heater). The pump 514 may also be used to heat the cabin of the vehicle as well.

Figure 6:
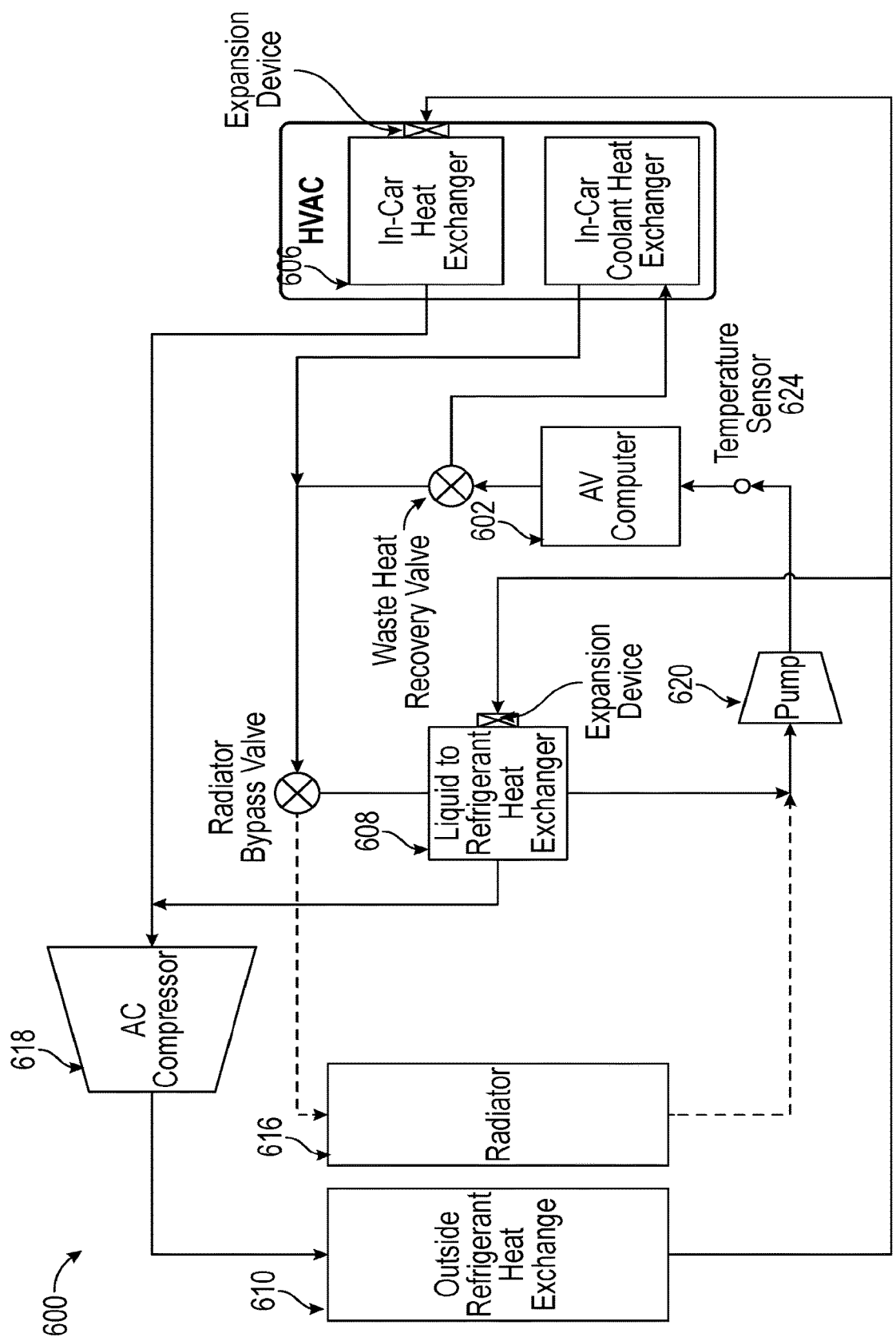
FIG. 6 depicts a schematic illustration of an example system architecture, in accordance with one or more example embodiments of the disclosure.

FIG. 6 depicts a schematic illustration of an example system 600 architecture, in accordance with one or more example embodiments of the disclosure. In some embodiments, the system 600 may represent the fourth example of a coolant loop configuration. The system 600 may include at least a computing system 602 (which may be the system 100 described above including the management controller 110, host CPU 102, FPGAs 104, GPUs 108, and the switch 112), an in-car heat exchanger 604, an in-car coolant heat exchanger 606, a liquid to refrigerant heat exchanger 608, an outside refrigerant heat exchanger 610, a radiator 616, a compressor 618, a pump 620, and/or a radiator bypass valve. The system 600 may also include one or more temperature sensors 624. In some embodiments, the system 600 may be used to provide heat to the in-car heat exchanger in the vehicle. This may allow the excess heat produced by the computing system 602 to effectively be used to heat the cabin of the vehicle (for example, when the vehicle is on).

FIG. 7 depicts a schematic illustration of an example system 700 architecture, in accordance with one or more example embodiments of the disclosure. In some embodiments, the system 700 may represent the fourth example of a coolant loop configuration. The system 700 may include at least a computing system 702 (which may be the system 100 described above including the management controller 110, host CPU 102, FPGAs 104, GPUs 108, and the switch 112), a liquid to refrigerant heat exchanger 704, a radiator 706, a pump 708, one or more bypass valves 710, and/or one or more temperature sensors 714. The liquid to refrigerant heat exchanger may also include an expansion device 712. The computing system 702 may also include a first set of computing elements 714 and a second set of computing elements 716. This system 700 may illustrate that in embodiments in which computing elements of the computing system 702 are heated using coolant loops instead of heat dissipation through the air, individual computing elements may be provided heat through the coolant loop. For example, a first computing element may be provided heat through the coolant loop, but a second element in the computing system 702 may be bypassed using a bypass valve 710. It should be noted that the use of the terms "first set of computing elements 714 and second set of computing elements 716" may not necessarily refer to two fixed groups of computing elements, but may rather indicate that individual elements may be heated or bypassed by the coolant loop, rather than all of the computing elements always being heated at the same time or to the same extent.

Figure 8:
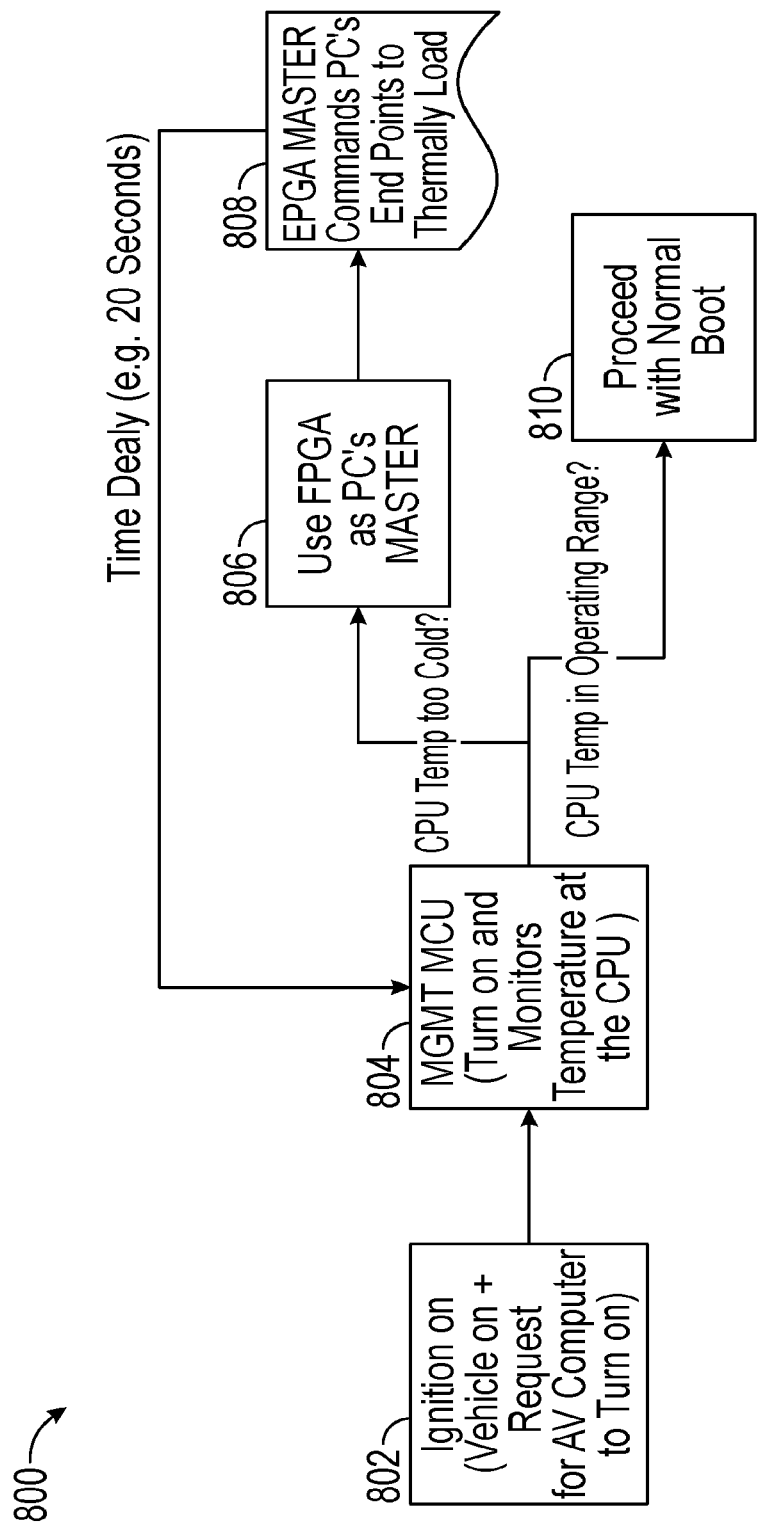
FIG. 8 depicts an example method in accordance with one or more example embodiments of the disclosure.

FIG. 8 depicts an example method 800 in accordance with one or more example embodiments of the disclosure. The example method 800 may represent a flow diagram depicting the method used to heat the host CPU to its operating temperature. The method 800 may begin with block 802, which may include identifying an activation sequence. An activation sequence may include one or more actions taking place, including the vehicle being turned on and/or the computing system of the vehicle receiving a request to turn on. Once the activation sequence is performed, at block 804, the management controller (for example, management controller 110) may turn on and query the host CPU for its current temperature. The management controller may similarly query any other computing elements in the vehicle to determine their respective temperatures. Based on the temperature received by the management controller, the method 800 may either proceed to block 806 or block 810. If the temperature of the host CPU is determined to be below its threshold operating temperature, then the method 800 may proceed to block 806. Otherwise, the method 800 may proceed to block 810. At block 806, the method 800 may involve using one of the FPGAs of the computing system of the vehicle as a host FPGA. That is, the computing system may operate in its "heating mode" as described above. For example, the host FPGA may be used as a PCIe master device that may be used to control any other device connected through a PCIe bus. At block 808, the host FPGA may then be used to send commands to the PCIe end points to thermally load. During this time, the method 800 may, at a given interval of time, return to block 804, where the management controller may query the host CPU to determine if it has reached its operating temperature threshold yet. For example, every 30 seconds (or any other time period), the management controller may determine if the host CPU has been heated to its operating temperature threshold. If the management controller determines that the host CPU is still below its operating temperature threshold, then the host FPGA may retain control over the PCIe bus and may continue to command other PCIe computing elements to thermally load to heat the host CPU (for example, blocks 804-808 may iterate until the host CPU reaches its threshold operating temperature). Once the management controller determines that the host CPU has reached its operating temperature threshold, then the management controller may transition the computing system to its normal mode of operating as described herein.

Figure 9:
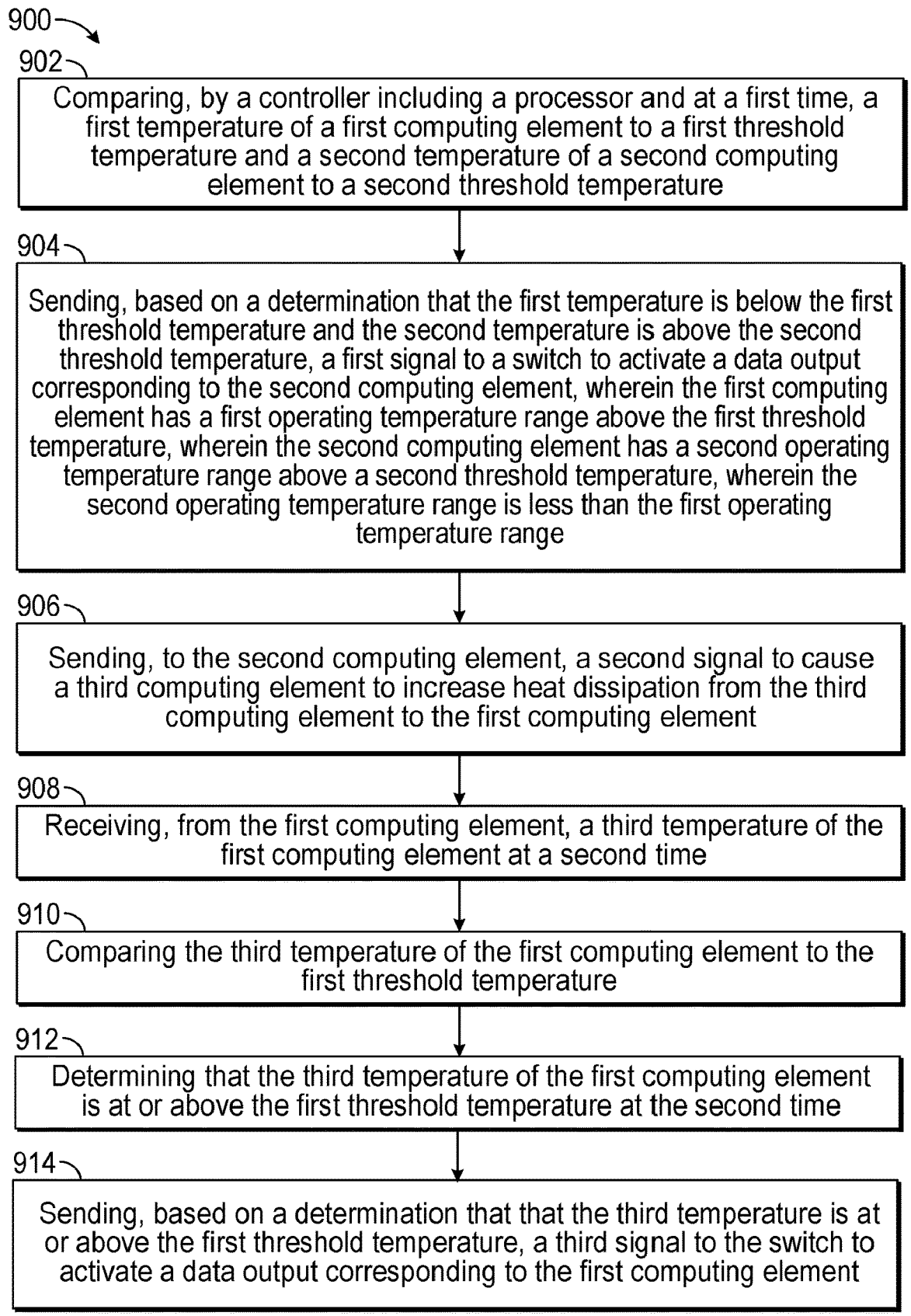
FIG. 9 depicts an example method in accordance with one or more example embodiments of the disclosure.

FIG. 9 is an example method 900 in accordance with one or more example embodiments of the disclosure. At block 902 of the method 900 in FIG. 9, the method may include comparing, by a controller including a processor and at a first time, a first temperature of a first computing element to a first threshold temperature and a second temperature of a second computing element to a second threshold temperature. Block 904 of the method 900 may include sending, based on a determination that the first temperature is below the first threshold temperature and the second temperature is above the second threshold temperature, a first signal to a switch to activate a data output corresponding to the second computing element, wherein the first computing element has a first operating temperature range above the first threshold temperature, wherein the second computing element has a second operating temperature range above a second threshold temperature, wherein the second operating temperature range is less than the first operating temperature range. In some embodiments, the first computing element may be the host CPU described herein and the second computing element may be a computing element used to heat the host CPU to its threshold operating temperature, such as the FPGAs or GPUs for example. The vehicle system may use a PCIe or other similar master slave communication protocol, with the FPGAs and GPUs serving as end points or slaves in the PCIe interface. In the scenarios described herein the host CPU may serve as the PCIe master device unless it is below its threshold operating temperature. In this case, then or more of the FPGAs may be configured as a host FPGA to serve as the master in place of the host CPU until the host CPU is able to reach its threshold operating temperature. The remaining FPGAs (the FPGAs not selected to be the master) may be used as PCIe end points that may be controlled by the master FPGA to provide heat to the host CPU (for example, in conjunction with other end point devices in the vehicle system, such as the GPUs) by increasing the processing load of the end points. It should also be noted that while FPGAs and GPUs are described as being used as the end points in the PCIe interface that may be for producing heat to heat the host CPU, any other type of computing element may similarly be used other than FPGAs or GPUs. Additionally, any master-slave protocol other than PCIe may also be used as well.

Block 906 of the method 900 may include sending, to the second computing element, a second signal to cause a third computing element to increase heat dissipation from the third computing element to the first computing element. Block 908 of the method 900 may include receiving, from the first computing element, a third temperature of the first computing element at a second time. Block 910 of the method 900 may include comparing the third temperature of the first computing element to the first threshold temperature. Block 912 of the method 900 may include determining that the third temperature of the first computing element is at or above the first threshold temperature at the second time. Block 914 of the method 900 may include sending, based on a determination that that the third temperature is at or above the first threshold temperature, a third signal to the switch to activate a data output corresponding to the first computing element. The instruction may be in the form of an instruction to the switch to switch to an upstream port connected to the host CPU. This may allow the host CPU to take over control over the computing elements now that it is within its operating temperature. The FPGA that was the host FPGA may then be reconfigured as another slave FPGA along with the other slave FPGAs (that is, all of the FPGAs may now receive instruction from the host CPU instead of some of the FPGAs receiving instruction from a host FPGA). The computing elements may then be used for their normal processing tasks (for example, processing sensor data from the vehicle).

The operations described and depicted in the illustrative process flow of FIG. 9 may be carried out or performed in any suitable order as desired in various example embodiments of the disclosure. Additionally, in certain example embodiments, at least a portion of the operations may be carried out in parallel. Furthermore, in certain example embodiments, less, more, or different operations than those depicted in FIG. 9 may be performed.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Certain aspects of the disclosure are described above with reference to block and flow diagrams of systems, methods, apparatuses, and/or computer program products according to example embodiments. It will be understood that one or more blocks of the block diagrams and flow diagrams, and combinations of blocks in the block diagrams and the flow diagrams, respectively, may be implemented by execution of computer-executable program instructions. Likewise, some blocks of the block diagrams and flow diagrams may not necessarily need to be performed in the order presented, or may not necessarily need to be performed at all, according to some embodiments. Further, additional components and/or operations beyond those depicted in blocks of the block and/or flow diagrams may be present in certain embodiments.

Accordingly, blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Figure 10:
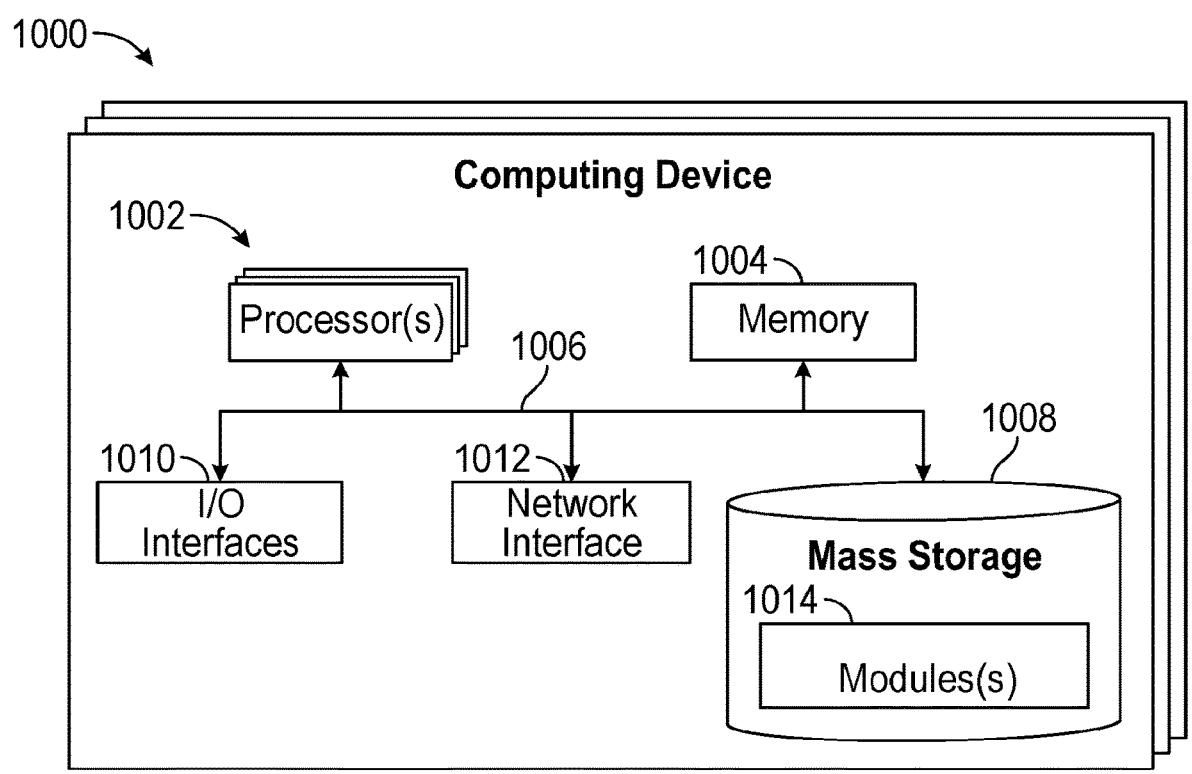
FIG. 10 depicts an example computing device in accordance with one or more example embodiments of the disclosure.

FIG. 10 illustrates an example computing device 1000, in accordance with one or more embodiments of this disclosure. The computing device 1000 may be a device used to perform any of the processing with respect to the flare artifact score determination or any other processing described herein. The computing device 1000 may include at least one processor 1002 that executes instructions that are stored in one or more memory devices (referred to as memory 1004). The instructions can be, for instance, instructions for implementing functionality described as being carried out by one or more modules and systems disclosed above or instructions for implementing one or more of the methods disclosed above. The processor(s) 1002 can be embodied in, for example, a CPU, multiple CPUs, a GPU, multiple GPUs, a TPU, multiple TPUs, a multi-core processor, a combination thereof, and the like. In some embodiments, the processor(s) 1002 can be arranged in a single processing device. In other embodiments, the processor(s) 1002 can be distributed across two or more processing devices (e.g., multiple CPUs; multiple GPUs; a combination thereof; or the like). A processor can be implemented as a combination of processing circuitry or computing processing units (such as CPUs, GPUs, or a combination of both). Therefore, for the sake of illustration, a processor can refer to a single-core processor; a single processor with software multithread execution capability; a multi-core processor; a multi-core processor with software multithread execution capability; a multi-core processor with hardware multithread technology; a parallel processing (or computing) platform; and parallel computing platforms with distributed shared memory. Additionally, or as another example, a processor can refer to an integrated circuit (IC), an ASIC, a digital signal processor (DSP), a FPGA, a PLC, a complex programmable logic device (CPLD), a discrete gate or transistor logic, discrete hardware components, or any combination thereof designed or otherwise configured (e.g., manufactured) to perform the functions described herein.

The processor(s) 1002 can access the memory 1004 by means of a communication architecture 1006 (e.g., a system bus). The communication architecture 1006 may be suitable for the particular arrangement (localized or distributed) and type of the processor(s) 1002. In some embodiments, the communication architecture 1006 can include one or many bus architectures, such as a memory bus or a memory controller; a peripheral bus; an accelerated graphics port; a processor or local bus; a combination thereof; or the like. As an illustration, such architectures can include an Industry Standard Architecture (ISA) bus, a Micro Channel Architecture (MCA) bus, an Enhanced ISA (EISA) bus, a Video Electronics Standards Association (VESA) local bus, an Accelerated Graphics Port (AGP) bus, a Peripheral Component Interconnect (PCI) bus, a PCI-Express bus, a Personal Computer Memory Card International Association (PCMCIA) bus, a Universal Serial Bus (USB), and or the like.

Memory components or memory devices disclosed herein can be embodied in either volatile memory or non-volatile memory or can include both volatile and non-volatile memory. In addition, the memory components or memory devices can be removable or non-removable, and/or internal or external to a computing device or component. Examples of various types of non-transitory storage media can include hard-disc drives, zip drives, CD-ROMs, digital versatile discs (DVDs) or other optical storage, magnetic cassettes, magnetic tape, magnetic disk storage or other magnetic storage devices, flash memory cards or other types of memory cards, cartridges, or any other non-transitory media suitable to retain the desired information and which can be accessed by a computing device.

As an illustration, non-volatile memory can include read only memory (ROM), programmable ROM (PROM), electrically programmable ROM (EPROM), electrically erasable programmable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The disclosed memory devices or memories of the operational or computational environments described herein are intended to include one or more of these and/or any other suitable types of memory. In addition to storing executable instructions, the memory 1004 also can retain data.

Each computing device 1000 also can include mass storage 1008 that is accessible by the processor(s) 1002 by means of the communication architecture 1006. The mass storage 1008 can include machine-accessible instructions (e.g., computer-readable instructions and/or computer-executable instructions). In some embodiments, the machine-accessible instructions may be encoded in the mass storage 1008 and can be arranged in components that can be built (e.g., linked and compiled) and retained in computer-executable form in the mass storage 1008 or in one or more other machine-accessible non-transitory storage media included in the computing device 1000. Such components can embody, or can constitute, one or many of the various modules disclosed herein. Such modules are illustrated as temperature regulation modules 1014.

Execution of the temperature regulation modules 1014, individually or in combination, by at least one of the processor(s) 1002, can cause the computing device 1000 to perform any of the operations described herein (for example, the operations described with respect to FIG. 10, as well as any other operations).

Each computing device 1000 also can include one or more input/output interface devices 1010 (referred to as I/O interface 1010) that can permit or otherwise facilitate external devices to communicate with the computing device 1000. For instance, the I/O interface 1010 may be used to receive and send data and/or instructions from and to an external computing device. The computing device 1000 also includes one or more network interface devices 1012 (referred to as network interface(s) 1012) that can permit or otherwise facilitate functionally coupling the computing device 1000 with one or more external devices. Functionally coupling the computing device 1000 to an external device can include establishing a wireline connection or a wireless connection between the computing device 1000 and the external device. The network interface devices 1012 can include one or many antennas and a communication processing device that can permit wireless communication between a vehicle and either another vehicle or an external device. The other vehicle can be, for example, one of the vehicles included in the network 110 or an out-of-network vehicle. The external device can be, for example, one of the mobile devices included in the network 110. Such a communication processing device can process data according to defined protocols of one or several radio technologies. The radio technologies can include, for example, 3G, Long Term Evolution (LTE), LTE-Advanced, 5G, IEEE 802.11, IEEE 802.16, Bluetooth, ZigBee, near-field communication (NFC), and the like.

In some embodiments, the computing device 1000 may be in communication with an imaging device 1016 (for example, through the I/O interface 1010 of the computing device as shown in FIG. 10). The imaging device 1016 may be the same as any of the imaging devices described herein (for example, an imaging device for which a flare artifact score is determined based on one or more images that the imaging device captures).

As used in this application, the terms "environment," "system," "unit," "module," "architecture," "interface," "component," and the like refer to a computer-related entity or an entity related to an operational apparatus with one or more defined functionalities. The terms "environment," "system," "module," "component," "architecture," "interface," and "unit," can be utilized interchangeably and can be generically referred to functional elements. Such entities may be either hardware, a combination of hardware and software, software, or software in execution. As an example, a module can be embodied in a process running on a processor, a processor, an object, an executable portion of software, a thread of execution, a program, and/or a computing device. As another example, both a software application executing on a computing device and the computing device can embody a module. As yet another example, one or more modules may reside within a process and/or thread of execution. A module may be localized on one computing device or distributed between two or more computing devices. As is disclosed herein, a module can execute from various computer-readable non-transitory storage media having various data structures stored thereon. Modules can communicate via local and/or remote processes in accordance, for example, with a signal (either analogic or digital) having one or more data packets (e.g., data from one component interacting with another component in a local system, distributed system, and/or across a network such as a wide area network with other systems via the signal).

As yet another example, a module can be embodied in or can include an apparatus with a defined functionality provided by mechanical parts operated by electric or electronic circuitry that is controlled by a software application or firmware application executed by a processor. Such a processor can be internal or external to the apparatus and can execute at least part of the software or firmware application. Still in another example, a module can be embodied in or can include an apparatus that provides defined functionality through electronic components without mechanical parts. The electronic components can include a processor to execute software or firmware that permits or otherwise facilitates, at least in part, the functionality of the electronic components.

In some embodiments, modules can communicate via local and/or remote processes in accordance, for example, with a signal (either analog or digital) having one or more data packets (e.g., data from one component interacting with another component in a local system, distributed system, and/or across a network such as a wide area network with other systems via the signal). In addition, or in other embodiments, modules can communicate or otherwise be coupled via thermal, mechanical, electrical, and/or electro-mechanical coupling mechanisms (such as conduits, connectors, combinations thereof, or the like). An interface can include input/output (I/O) components as well as associated processors, applications, and/or other programming components.

Further, in the present specification and annexed drawings, terms such as "store," "storage," "data store," "data storage," "memory," "repository," and substantially any other information storage component relevant to the operation and functionality of a component of the disclosure, refer to memory components, entities embodied in one or several memory devices, or components forming a memory device. It is noted that the memory components or memory devices described herein embody or include non-transitory computer storage media that can be readable or otherwise accessible by a computing device. Such media can be implemented in any methods or technology for storage of information, such as machine-accessible instructions (e.g., computer-readable instructions), information structures, program modules, or other information objects.

Conditional language, such as, among others, "can," "could," "might," or "may," unless specifically stated otherwise, or otherwise understood within the context as used, is generally intended to convey that certain implementations could include, while other implementations do not include, certain features, elements, and/or operations. Thus, such conditional language generally is not intended to imply that features, elements, and/or operations are in any way required for one or more implementations or that one or more implementations necessarily include logic for deciding, with or without user input or prompting, whether these features, elements, and/or operations are included or are to be performed in any particular implementation.

What has been described herein in the present specification and annexed drawings includes examples of systems, devices, techniques, and computer program products that, individually and in combination, permit the automated provision of an update for a vehicle profile package. It is, of course, not possible to describe every conceivable combination of components and/or methods for purposes of describing the various elements of the disclosure, but it can be recognized that many further combinations and permutations of the disclosed elements are possible. Accordingly, it may be apparent that various modifications can be made to the disclosure without departing from the scope or spirit thereof. In addition, or as an alternative, other embodiments of the disclosure may be apparent from consideration of the specification and annexed drawings, and practice of the disclosure as presented herein. It is intended that the examples put forth in the specification and annexed drawings be considered, in all respects, as illustrative and not limiting. Although specific terms are employed herein, they are used in a generic and descriptive sense only and not for purposes of limitation.

That which is claimed is:

1. A system for heating computing elements in a vehicle comprising:
   a first computing element with a first operating temperature range above a first threshold temperature;
   a second computing element with a second operating temperature range above a second threshold temperature;
   a switch; and
   a controller including a processor configured to:
   obtain a first temperature of the first computing element and a second temperature of the second computing element at a first time;
   send, based at least in part on a determination that the first temperature of the first computing element is below the first threshold temperature and the second temperature of the second computing element is above the second threshold temperature, a first signal to the switch to activate a data output corresponding to the second computing element;
   send, by the second computing element, a second signal to instruct a third computing element to increase heat dissipation from the third computing element to the first computing element;
   obtain a third temperature of the first computing element at a second time; and
   send, based at least in part on a determination that the third temperature of the first computing element is at or above the first threshold temperature, a third signal to the switch to activate a data output corresponding to the first computing element.

2. The system of claim 1, wherein the controller is further configured to:
   receive, from the first computing element, a second temperature of the first computing element at the first time;
   compare the second temperature of the first computing element to the first threshold temperature;
   determine that the second temperature of the first computing element is below the first threshold temperature at the first time;
   receive, from the second computing element, a second temperature of the second computing element;
   compare the second temperature of the second computing element to the second threshold temperature; and
   determine that the second temperature of the second computing element is above the second threshold temperature.

3. The system of claim 1, wherein the first computing element is a host central processing unit (CPU), the second computing element is a field programmable gate array (FPGA), and the third computing element is a graphics processing unit (GPU).

4. The system of claim 1, wherein the first time corresponds to an activation sequence of the vehicle, and wherein the activation sequence includes a request to initiate the first computing element, the second computing element, or the third computing element.

5. The system of claim 1, wherein the controller is further configured to:
   send, based at least in part on the determination that the first temperature of the first computing element is below the first threshold temperature and the second temperature of the second computing element is above the second threshold temperature, a signal to the switch to deactivate a data output corresponding to the first computing element.

6. The system of claim 1, wherein the controller is further configured to:
   send, based at least in part on the determination that the third temperature of the first computing element is at or above the first threshold temperature, a signal to the switch to deactivate a data output corresponding to the second computing element.

7. The system of claim 1, wherein the first computing element, subsequent to the second time, transmits instructions to at least one of the second computing element or the third computing element through the switch.

8. A computer-implemented method for heating computing elements in a vehicle, comprising:
obtaining, by a controller including a processor, a first temperature of a first computing element with a first operating temperature range above a first threshold temperature and a second temperature of a second computing element with a second operating temperature range above a second threshold temperature;
sending, by the controller, a first signal to a switch to activate a data output corresponding to the second computing element based at least in part on a determination that the first temperature of the first computing element is below the first threshold temperature and the second temperature of the second computing element is above the second threshold temperature;
sending, by the second computing element, a second signal to a third computing element to increase heat dissipation from the third computing element to the first computing element;
obtaining, by the controller, a third temperature of the first computing element at a second time; and
sending, by the controller, a third signal to the switch to activate a data output corresponding to the first computing element based at least in part on a determination that the third temperature of the first computing element is at or above the first threshold temperature.

9. The computer-implemented method of claim 8, further comprising:
receiving, from the first computing element, a second temperature of the first computing element at the first time;
comparing the second temperature of the first computing element to the first threshold temperature;
determining that the second temperature of the first computing element is below the first threshold temperature at the first time;
receiving, from the second computing element, a second temperature of the second computing element;
comparing the second temperature of the second computing element to the second threshold temperature; and
determining that the second temperature of the second computing element is above the second threshold temperature.

10. The computer-implemented method of claim 8, wherein the first computing element is a host central processing unit (CPU), the second computing element is a field programmable gate array (FPGA), and the third computing element is a graphics processing unit (GPU).

11. The computer-implemented method of claim 8, wherein the first time corresponds to an activation sequence of the vehicle, and wherein the activation sequence includes a request to initiate the first computing element, the second computing element, or the third computing element.

12. The computer-implemented method of claim 8, further comprising:
sending, by the controller, a signal to the switch to deactivate a data output corresponding to the first computing element based at least in part on the determination that the first temperature of the first computing element is below the first threshold temperature and the second temperature of the second computing element is above the second threshold temperature.

13. The computer-implemented method of claim 8, further comprising:
sending, by the controller, a signal to the switch to deactivate a data output corresponding to the second computing element based at least in part on the determination that the third temperature of the first computing element is at or above the first threshold temperature.

14. The computer-implemented method of claim 8, wherein the first computing element, subsequent to a second time, transmits instructions to at least one of the second computing element or the third computing element through the switch.

15. A vehicle comprising:
a first computing element with a first operating temperature range above a first threshold temperature;
a second computing element with a second operating temperature range above a second threshold temperature, wherein the second operating temperature range is less than the first operating temperature range;
a switch; and
a controller including a processor configured to:
obtain a first temperature of the first computing element and a second temperature of the second computing element at a first time;
send, based at least in part on a determination that the first temperature of the first computing element is below the first threshold temperature and the second temperature of the second computing element is above the second threshold temperature, a first signal to the switch to activate a data output corresponding to the second computing element;
send, by the second computing element, a second signal to a third computing element to increase heat dissipation from the third computing element to the first computing element;
obtain a third temperature of the first computing element at a second time; and
send, based at least in part on a determination that the third temperature of the first computing element is at or above the first threshold temperature, a third signal to the switch to activate a data output corresponding to the first computing element.

16. The vehicle of claim 15, wherein the controller is further configured to:
receive, from the first computing element, a second temperature of the first computing element at the first time;
compare the second temperature of the first computing element to the first threshold temperature;
determine that the second temperature of the first computing element is below the first threshold temperature at the first time;
receive, from the second computing element, a second temperature of the second computing element;
compare the second temperature of the second computing element to the second threshold temperature; and
determine that the second temperature of the second computing element is above the second threshold temperature.

17. The vehicle of claim 15, wherein the first computing element is a host central processing unit (CPU), the second computing element is a field programmable gate array (FPGA), and the third computing element is a graphics processing unit (GPU).

18. The vehicle of claim 15, wherein the first time corresponds to an activation sequence of the vehicle, wherein the activation sequence includes a request to initiate the first computing element, the second computing element, or the third computing element.

19. The vehicle of claim 15, wherein the controller is further configured to:

send, based at least in part on the determination that the third temperature of the first computing element is at or above the first threshold temperature, a signal to the switch to deactivate a data output corresponding to the second computing element.

20. The vehicle of claim 15, wherein the first computing element, subsequent to the second time, transmits instructions to at least one of the second computing element or the third computing element through the switch.

* * * * *